United States Patent
Moon et al.

(10) Patent No.: US 10,790,748 B2
(45) Date of Patent: *Sep. 29, 2020

(54) SOFT-START CIRCUIT AND BUCK CONVERTER COMPRISING THE SAME

(71) Applicant: SEMICONDUCTOR COMPONENTS INDUSTRIES, LLC, Phoenix, AZ (US)

(72) Inventors: SangCheol Moon, Daejeon (KR); Gwanbon Koo, Bucheon-si (KR); Chenghao Jin, Bucheon-si (KR); Bonggeun Chung, Siheung-si (KR)

(73) Assignee: SEMICONDUCTOR COMPONENTS INDUSTRIES, LLC, Phoenix, AZ (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/660,509

(22) Filed: Oct. 22, 2019

(65) Prior Publication Data
US 2020/0052592 A1    Feb. 13, 2020

Related U.S. Application Data

(63) Continuation of application No. 15/196,559, filed on Jun. 29, 2016, now Pat. No. 10,491,117.
(Continued)

(51) Int. Cl.
*H02M 1/36*    (2007.01)
*H02M 1/00*    (2006.01)
(Continued)

(52) U.S. Cl.
CPC ............ *H02M 3/158* (2013.01); *G01R 19/04* (2013.01); *H02M 1/36* (2013.01); *H02M 1/44* (2013.01); *H02M 3/156* (2013.01); *H02M 7/04* (2013.01); *H02M 7/217* (2013.01); *H02M 2001/0003* (2013.01); *H02M 2001/0009* (2013.01); *H02M 2001/0022* (2013.01);
(Continued)

(58) Field of Classification Search
CPC . H02M 2001/0003; H02M 2001/0009; H02M 2001/0022; H02M 2001/0025; H02M 2001/0029; H02M 2001/0058; H02M 1/08; H02M 1/36; H02M 1/44; H02M 3/156; H02M 3/158; H02M 7/04; H02M 7/217

See application file for complete search history.

(56) References Cited

U.S. PATENT DOCUMENTS

| 7,453,251 B1 | 11/2008 | Mehas et al. |
| 2004/0245974 A1 | 12/2004 | Kitani et al. |

(Continued)

OTHER PUBLICATIONS

Fairchild Semiconductor, "FAN9611 / FAN9612 Interleaved Dual BCM PFC Controllers," Oct. 2009, 35 pages, rev. 1.0.1.

*Primary Examiner* — Jue Zhang
*Assistant Examiner* — David A. Singh
(74) *Attorney, Agent, or Firm* — AMPACC Law Group, PLLC (57) ABSTRACT

A buck converter includes a power switch having a first end to receive an input voltage, and a soft start circuit configured to compensate a soft start voltage during a soft start time period according to a result of comparing a feedback voltage corresponding to an output voltage of the buck converter and
(Continued)

an input detection voltage corresponding to the input voltage. The buck converter controls switching of the power switch using the soft start voltage.

20 Claims, 9 Drawing Sheets

Related U.S. Application Data (60) Provisional application No. 62/185,834, filed on Jun. 29, 2015.

(51) Int. Cl.
*H02M 3/158* (2006.01)
*G01R 19/04* (2006.01)
*H02M 3/156* (2006.01)
*H02M 1/44* (2007.01)
*H02M 7/04* (2006.01)
*H02M 7/217* (2006.01)

(52) U.S. Cl.
CPC ............... *H02M 2001/0025* (2013.01); *H02M 2001/0048* (2013.01); *H02M 2001/0054* (2013.01); *H02M 2001/0058* (2013.01); *Y02B 70/1491* (2013.01)

(56) References Cited

U.S. PATENT DOCUMENTS

| | | |
|---|---|---|
| 2005/0110469 A1 | 5/2005 | Inaba et al. |
| 2005/0270804 A1 | 12/2005 | Liu |
| 2007/0290667 A1 | 12/2007 | Nagai et al. |
| 2008/0100274 A1 | 5/2008 | Hayakawa |
| 2011/0109294 A1 | 5/2011 | Larson |
| 2011/0122662 A1 | 5/2011 | Li et al. |
| 2011/0211374 A1 | 9/2011 | Yoshida |
| 2012/0049820 A1 | 3/2012 | Moussaoui et al. |
| 2012/0155127 A1 | 6/2012 | Brokaw |
| 2013/0119877 A1 | 5/2013 | Chung et al. |
| 2013/0328496 A1 | 12/2013 | Chen et al. |
| 2014/0049994 A1 | 2/2014 | Ishii |
| 2014/0133202 A1 | 5/2014 | Tamaoka |
| 2014/0145698 A1 | 5/2014 | Saito et al. |
| 2014/0185340 A1 | 7/2014 | Maruyama |
| 2014/0217999 A1 | 8/2014 | Wibben et al. |
| 2015/0180355 A1 | 6/2015 | Freeman et al. |
| 2015/0263542 A1 | 9/2015 | Sato et al. |
| 2015/0271906 A1 | 9/2015 | Kamata |
| 2015/0288286 A1 | 10/2015 | Chu |
| 2016/0118888 A1 | 4/2016 | Xu et al. |
| 2016/0181931 A1 | 6/2016 | Song et al. |
| 2018/0019656 A1 | 1/2018 | Matsuda et al. |
| 2018/0198363 A1 | 7/2018 | Watanabe |

SOFT-START CIRCUIT AND BUCK CONVERTER COMPRISING THE SAME

CROSS-REFERENCE TO RELATED APPLICATIONS

This application is a Continuation of U.S. application Ser. No. 15/196,559, filed Jun. 29, 2016, which claims the benefit of U.S. Provisional Application No. 62/185,834, filed on Jun. 29, 2015, the entire contents of which are incorporated herein by reference.

BACKGROUND

(a) Technical Field

Embodiments relate to a soft start circuit and a buck converter including the same.

(b) Description of the Related Art

When a buck converter has an output voltage higher than an input voltage, a switch of the buck converter is not switched and thus a current does not flow through an inductor of the buck converter.

Generally, the buck converter also uses a reference signal that constantly increases for a soft start. When an output voltage is higher than an input voltage, a difference between a feedback voltage corresponding to the output voltage and a voltage of the reference signal increases. A control voltage for controlling a switching operation is determined according to the difference between the feedback voltage and the reference signal voltage. In this case, the control voltage may be saturated due to a sudden increase in the difference between the two voltages when the output voltage is higher than the input voltage during the soft start time period.

Then, an overshoot occurs in the output voltage, and a time taken to reach a steady state after the soft start increases.

SUMMARY

The present invention is directed to providing a soft start circuit and a buck converter including the same.

According to an aspect of the present invention, there is provided a switch control circuit for a power switch is coupled to an inductor between an input terminal and an output terminal in a converter circuit. The switch control circuit includes a soft start circuit configured to compensate a soft start voltage during a soft start time period according to a result of comparing a feedback voltage corresponding to an output voltage of the output terminal and an input detection voltage corresponding to an input voltage of the input terminal and a circuit configured to control switching of the power switch by using the soft start voltage and the feedback voltage during the soft start time period.

According to another aspect of the present invention, there is provided a buck converter including a power switch having a first end to receive an input voltage, and a soft start circuit configured to compensate a soft start voltage during a soft start time period according to a result of comparing a feedback voltage corresponding to an output voltage of the buck converter and an input detection voltage corresponding to the input voltage. The buck converter may control switching of the power switch using the soft start voltage.

The soft start circuit may decrease the soft start voltage during the soft start time period when the feedback voltage is higher than the input detection voltage. The soft start circuit may include a comparator configured to compare the feedback voltage and the input detection voltage, a first transistor configured to perform switching according to an output of the comparator and having a first end coupled to a capacitor by which the soft start voltage is generated, and a current sink coupled to a second end of the first transistor.

The soft start circuit may further include a current source coupled to the capacitor.

The soft start circuit may further include a second transistor configured to perform switching according to the output of the comparator and coupled between the capacitor and the current source.

The soft start circuit may maintain the soft start voltage at a constant level during the soft start time period when the feedback voltage is higher than the input detection voltage. The soft start circuit may include a comparator configured to compare the feedback voltage and the input detection voltage, a transistor configured to perform switching according to an output of the comparator and having a first end coupled to a capacitor by which the soft start voltage is generated, and a current source coupled to a second end of the transistor.

The soft start circuit may decrease a slope of the soft start voltage during the soft start time period when the feedback voltage is higher than the input detection voltage.

The soft start circuit may include a comparator configured to compare the feedback voltage and the input detection voltage, a first transistor configured to perform switching according to an output of the comparator and having a first end coupled to a capacitor by which the soft start voltage is generated, a first current source coupled to a second end of the first transistor, a second transistor configured to perform switching according to the output of the comparator and having a first end coupled to the capacitor, and a second current source coupled to a second end of the second transistor.

The first transistor and the second transistor may have different channel types.

The present invention provides a soft start circuit and a buck converter including the same.

DETAILED DESCRIPTION OF THE EMBODIMENTS

Hereinafter, exemplary embodiments will be described in detail with reference to the accompanying drawings so that they can be easily practiced by those skilled in the art to which the present invention pertains. The present invention may, however, be embodied in many different forms and should not be construed as being limited to the embodiments set forth herein. In the accompanying drawings, portions irrelevant to a description of the exemplary embodiments will be omitted for clarity. Moreover, like reference numerals refer to like elements throughout.

In this disclosure, when one part (or element, device, etc.) is referred to as being "connected" to another part (or element, device, etc.), it should be understood that the former can be "directly connected" to the latter, or "electrically connected" to the latter via an intervening part (or element, device, etc.). Furthermore, when one part is referred to as "comprising (or including or having)" other elements, it should be understood that it can comprise (or include or have) only those elements, or other elements as well as those elements unless specifically described otherwise.

A soft start circuit according to an embodiment controls a soft start voltage according to output voltage information. Hereinafter, embodiments of the present invention will be described with reference to the accompanying drawings.

Figure 1:
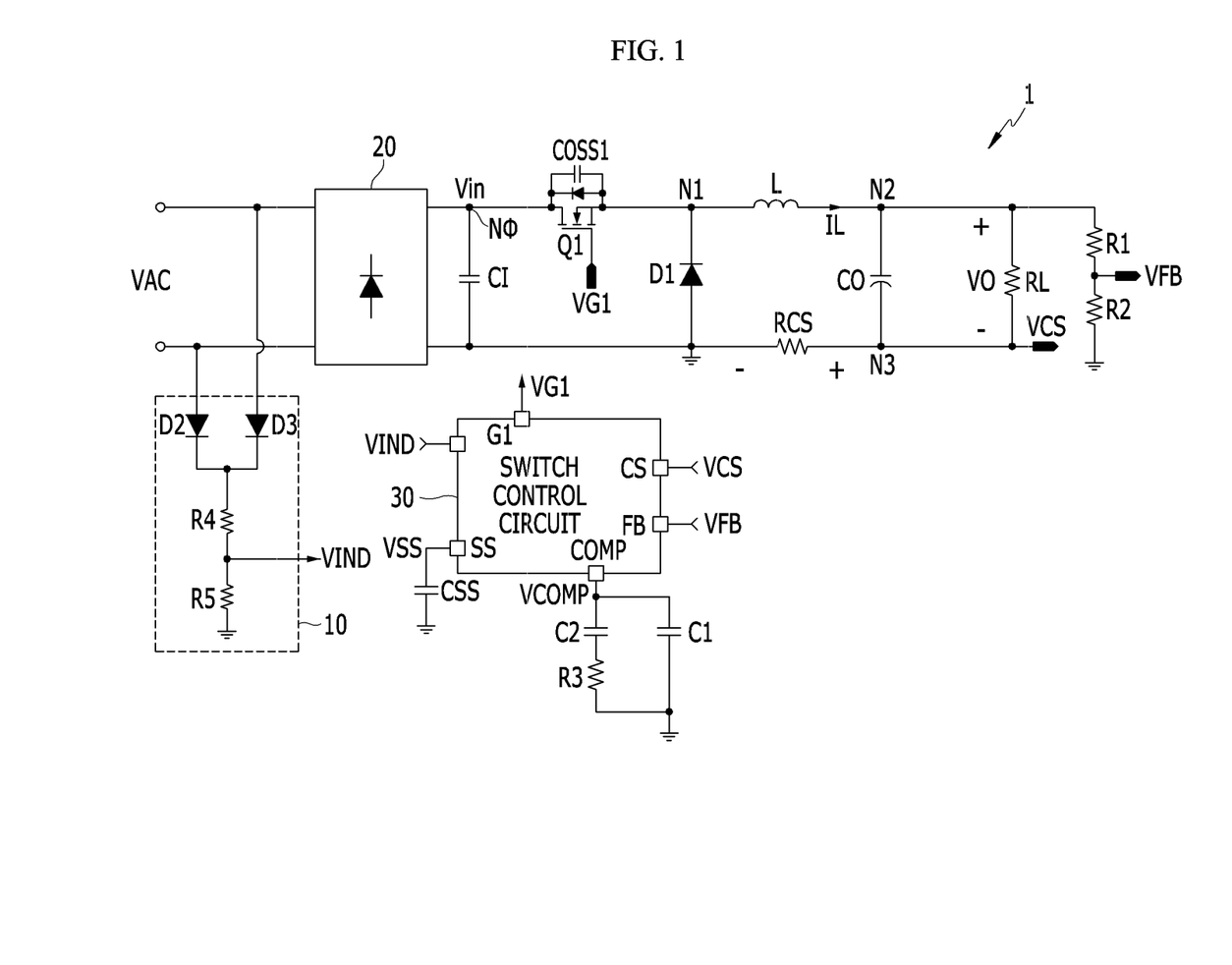
FIG. 1 is a diagram showing a buck converter according to an embodiment.

FIG. 1 is a diagram showing a buck converter according to an embodiment.

As shown in FIG. 1, a buck converter 1 includes an input detection unit 10, a rectifier circuit 20, a power switch Q1, and a switch control circuit 30.

An alternating-current input VAC is rectified to a line input voltage Vin through the rectifier circuit 20. Hereinafter, the line input voltage Vin is referred to as an input voltage. A noise component of the input voltage Vin may be filtered out through a capacitor CI connected to the both ends of the rectifier circuit 20.

The input detection unit 10 rectifies the alternating-current input VAC to generate an input detection voltage VIND corresponding to the input voltage Vin. When a load RL is a light load, the input voltage Vin may not decrease according to a waveform of the alternating-current input VAC.

The buck converter 1 may include the input detection unit 10 in order to accurately detect a section in which an output voltage VO is higher than the rectified waveform of the alternating-current input VAC. However, on a condition that the load RL is heavier than a light load, when the buck converter 1 operates, the buck converter 1 may not include the input detection unit 10 and may use information regarding the input voltage Vin rather than the input detection unit 10.

The input detection unit 10 includes two diodes D2 and D3 and two resistors R4 and R5. An anode of the diode D2 is connected to one of both input terminals of the alternating-current input VAC. An anode of the diode D3 is connected to the other of both the input terminals of the alternating-current input VAC. Cathodes of the diode D2 and the diode D3 are connected to each other. The resistors R4 and R5 are connected in series between the ground and the cathodes of the diodes D2 and D3. A voltage of a node to which the resistor R4 and the resistor R5 are connected is the input detection voltage VIND.

The input detection unit 10 shown in FIG. 1 is merely an example, and the present invention is not limited thereto.

The power switch Q1 and an inductor L are electrically connected between a node NO to which the input voltage Vin is input and a node N2 of the output voltage VO. The input voltage Vin is input to a drain of the power switch Q1. A source of the power switch Q1 is connected to a node N1. A cathode of a diode D1 is connected to the node N1. An anode of the diode D1 is connected to the ground.

The power switch Q1 is implemented as an n-channel type metal-oxide semiconductor field-effect transistor (MOSFET). A gate voltage VG1 is input to a gate of the power switch Q1. The power switch Q1 is turned on when the gate voltage VG1 is at a high level and is turned off when the gate voltage VG1 is at a low level.

The inductor L is connected between the node N1 and the node N2. A capacitor CO is connected between the node N2 and a node N3. A resistor RCS is connected between the node N3 and the ground. The output voltage VO is a voltage across the capacitor CO and is supplied to the load RL.

The resistor RCS is a resistor for detecting an inductor current IL flowing through the inductor L. A voltage of the node N3 is a voltage that is determined according to the inductor current IL and the resistor RCS, and is hereinafter referred to as a detection voltage VCS. A resistor R1 and a resistor R2 are connected in series between the node N2 and the ground. The output voltage VO is divided by the resistor R1 and the resistor R2 to become a feedback voltage VFB.

During an ON time period of the power switch Q1, the inductor current IL flowing through the inductor L also flows to the ground through the capacitor CO and the resistor RCS. When the power switch Q1 is turned off, and the diode D1 becomes conductive, the inductor current IL decreases while flowing through the diode D1, the inductor L, the capacitor CO, and the resistor RCS.

The output voltage VO may be regulated by controlling the inductor current IL through a switching operation of the power switch Q1.

The feedback voltage VFB and the detection voltage VCS are input through a feedback pin FB and a detection pin CS of the switch control circuit 30, respectively. The gate voltage VG1 is output through a gate pin G1. A capacitor C1 is connected between a compensation pin COMP of the switch control circuit 30 and the ground. A capacitor C2 and a resistor R3 are connected in series between the compensation pin COMP and the ground.

The switch control circuit 30 generates the gate voltage VG1 that controls a switching operation of the power switch Q1 using the feedback voltage VFB, a comparison voltage VCOMP corresponding to the feedback voltage VFB, and the detection voltage VCS.

The switch control circuit 30 detects a section in which the input voltage Vin is lower than the output voltage VO on the basis of a result of comparing the input detection voltage VIND input through an input detection pin AC during a soft start time period and the feedback voltage VFB input through the feedback pin FB. The switch control circuit 30 controls a slope of a soft start voltage VSS during the detected section.

The switch control circuit 30 may generate the soft start voltage VSS using a capacitor CSS connected to a pin SS.

The switch control circuit 30 may control the soft start voltage VSS by controlling an current supplied to the capacitor CSS.

Figure 2:
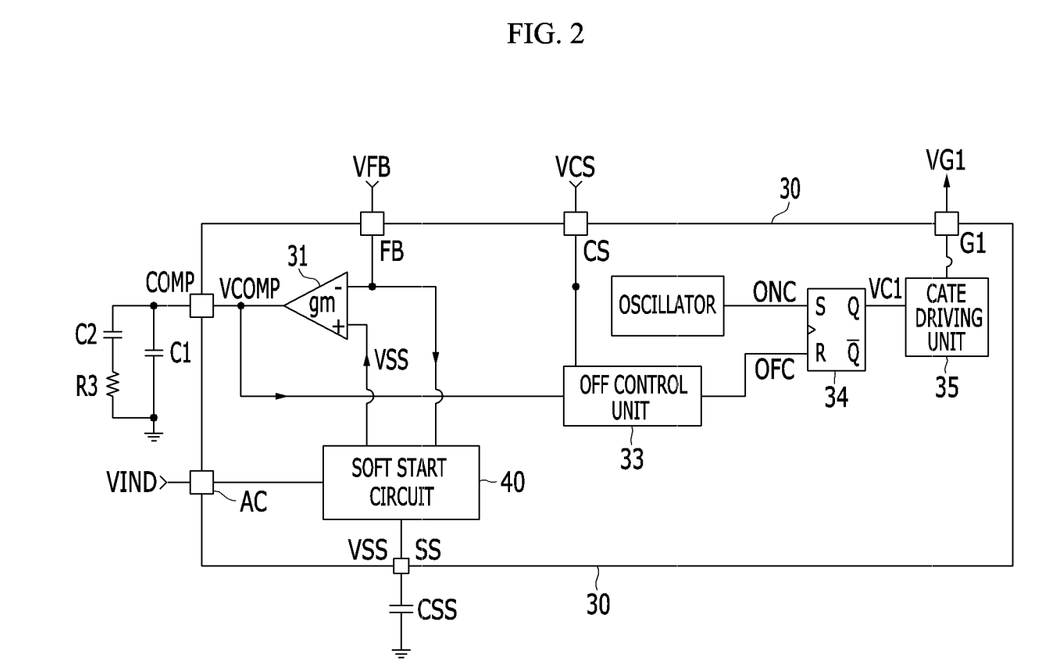
FIG. 2 is a diagram showing a switch control circuit according to an embodiment.

FIG. 2 is a diagram showing a switch control circuit according to an embodiment.

As shown in FIG. 2, the switch control circuit 30 includes an operational amplifier 31, an oscillator 32, an OFF control unit 33, an SR flip-flop 34, a gate driving unit 35, and a soft start circuit 40.

The operational amplifier 31 amplifies a difference between the feedback voltage VFB input to an inverting terminal (−) and a voltage input to a non-inverting terminal (+) and outputs the difference. The comparison voltage VCOMP is generated by the capacitors C1 and C2 and the resistor R3 by performing frequency gain compensation on an output of the operational amplifier 31. During the soft start time period, the soft start voltage VSS is input to the inverting terminal (−) of the operational amplifier 31. When the soft start time period passes, a reference voltage having a predetermined level may be input instead of the soft start voltage VSS.

The OFF control unit 33 outputs an OFF signal OFC for controlling switching according to any one of peak current mode control and voltage mode control. The power switch Q1 is turned off according to the OFF signal OFC.

The OFF control unit 33 may generate the OFF signal OFC on the basis of a result of comparison between the comparison voltage VCOMP and the detection voltage VCS according to the peak current mode control. Alternatively, the OFF control unit 33 may generate the OFF signal OFC on the basis of a result of comparison between the comparison voltage VCOMP and a predetermined signal synchronized with a switching frequency according to the voltage mode control. In this case, the predetermined signal synchronized with the switching frequency may have a sawtooth waveform that increases during one switching period of the power switch Q1 after a turn-on time of the power switch Q1.

According to an internal clock, the oscillator 32 outputs a high-level ON signal ONC upon a rising edge and outputs a low-level ON signal ONC upon a falling edge.

The SR flip-flop 34 raises a gate control signal VC1 to a high level according to an input of a set terminal S and lowers the gate control signal VC1 to a low level according to an input of a reset terminal R. The ON signal ONC is input to the set terminal S of the SR flip-flop 34. The OFF signal OFC is input to the reset terminal R of the SR flip-flop 34. An output terminal Q of the SR flip-flop 34 is connected to the gate driving unit 35.

The gate driving unit 35 generates the gate voltage VG1 according to the gate control signal VC1. For example, the gate driving unit 35 generates a high-level gate voltage VG1 according to a high-level gate control signal VC1 and generates a low-level gate voltage VG1 according to a low-level gate control signal VC1.

The soft start circuit 40 detects a section in which the input voltage Vin is lower than the output voltage VO on the basis of a result of comparing the input detection voltage VIND and the feedback voltage VFB. The soft start circuit 40 adjusts the slope of the soft start voltage VSS by controlling an current supplied to the capacitor CSS during the detected section.

The soft start circuit 40 may be implemented in various manners.

First, the soft start circuit 40 according to an embodiment will be described with reference to FIGS. 3 and 4.

Figure 3:
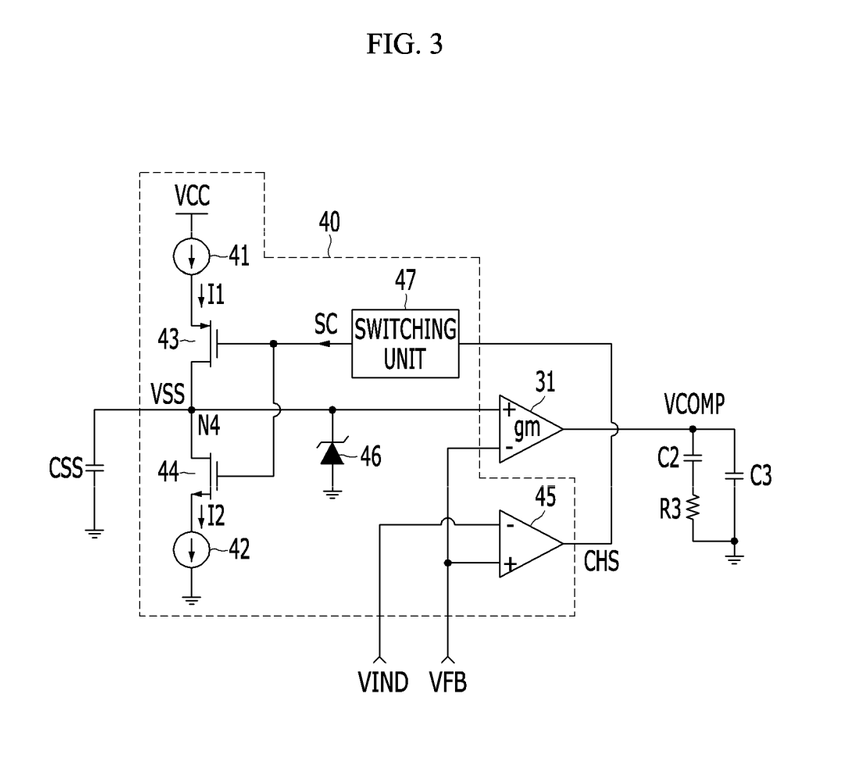
FIG. 3 is a diagram showing a configuration of a soft start circuit according to an embodiment.

FIG. 3 is a diagram showing a configuration of a soft start circuit according to an embodiment.

As shown in FIG. 3, the soft start circuit 40 includes a current source 41, a current sink 42, two transistors 43 and 44, a comparator 45, a Zener diode 46, and a switching unit 47.

The transistor 43 is connected between the current source 41 and a node N4. The current source 41 supplies an current I1 to the capacitor CSS through the transistor 43. During an ON time period of the transistor 43, the capacitor CSS is charged by the current I1. Thus, the soft start voltage VSS increases.

The transistor 44 is connected between the current sink 42 and the node N4. The current sink 42 sinks an current I2 from the capacitor CSS to the ground through the transistor 44. During an ON time period of the transistor 44, the capacitor CSS is discharged by the current I2, and thus the soft start voltage VSS decreases.

The comparator 45 outputs a result of comparing the feedback voltage VFB and the input detection voltage VIND. The input detection voltage VIND is input to an inverting terminal (−) of the comparator 45. The feedback voltage VFB is input to a non-inverting terminal (+) of the comparator 45. The comparator 45 outputs a high level voltage CHS when the input of the non-inverting terminal (+) is equal to or greater than the input of the inverting terminal (−). Otherwise, the comparator 45 outputs a low level voltage CHS.

The switching unit 47 determines the level of a signal SC according to the voltage CHS during the soft start time period and generates a low level signal SC after the soft start time period. For example, the switching unit 47 generates a high level signal SC according to a high level voltage CHS during the soft start time period and generates a low level signal SC according to a low level voltage CHS.

The transistor 43 is a p-channel type transistor, and the transistor 44 is an n-channel type transistor. Accordingly, when the feedback voltage VFB is equal to or higher than the input detection voltage VIND during the soft start time period, the transistor 44 is turned on by a high level signal SC. Thus, the soft start voltage VSS decreases according to the current I2. When the feedback voltage VFB is lower than the input detection voltage VIND, the transistor 43 is turned on by a low level signal SC. Thus, the soft start voltage VSS increases according to the current I1.

The Zener diode 46 is connected to the node N4 and configured to perform clamping such that the soft start voltage VSS does not exceed a Zener voltage. After the soft start time period ends, the soft start voltage VSS may be maintained as a Zener voltage.

Figure 4:
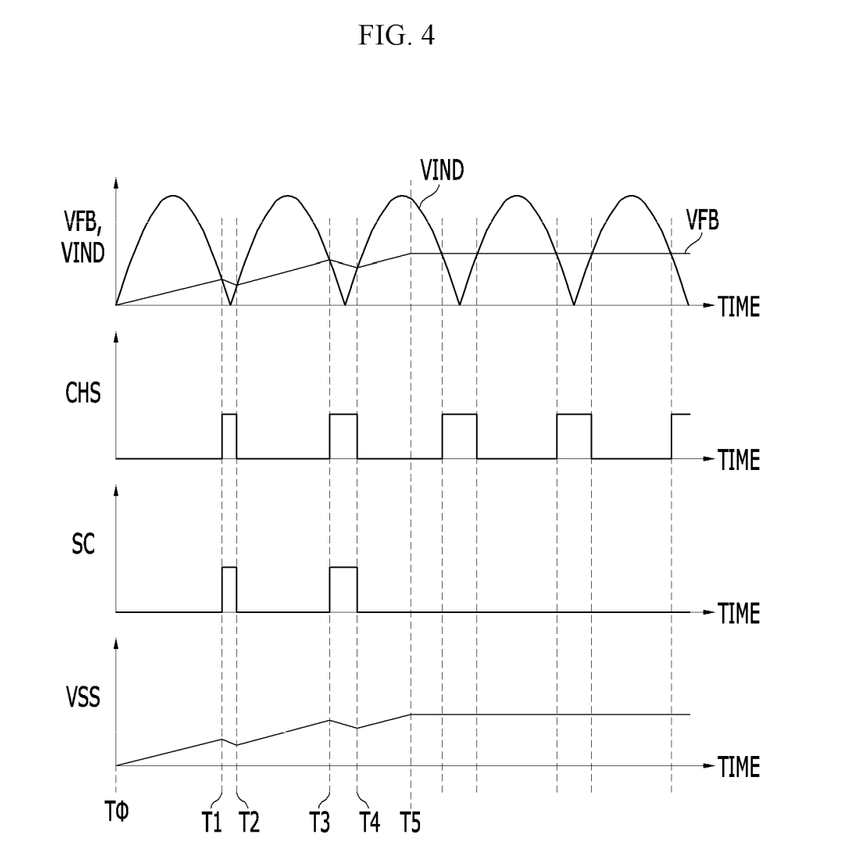
FIG. 4 is a waveform chart showing an input detection voltage, a feedback voltage, and a soft start voltage according to an embodiment.

FIG. 4 is a waveform chart showing an input detection voltage, a feedback voltage, and a soft start voltage according to an embodiment.

As shown in FIG. 4, the input detection voltage VIND is based on a waveform obtained by rectifying the alternating-current input VAC. The input detection voltage VIND has a waveform synchronized with the input voltage Vin. The two voltages may have substantially the same waveform.

Since the input detection voltage VIND is higher than the feedback voltage VFB during a time period between T0 and T1, the voltage CHS, which is an output of the comparator 45, is at a low level, and the signal SC is also at a low level like the voltage CHS. Then, the transistor 43 is turned on, and the capacitor CSS is charged by the current I1. Thus, the soft start voltage VSS increases.

At time T1, the feedback voltage VFB reaches the input detection voltage VIND. At time T1, the voltage CHS rises to a high level, and like the voltage CHS, the signal SC rises to a high level. After time T1, the transistor 44 is turned on, and the capacitor CSS is discharged by the current I2. Thus, the soft start voltage VSS decreases. As the soft start voltage VSS decreases, the output voltage VO decreases, and also the feedback voltage VFB decreases.

At time T2, the input detection voltage VIND becomes higher than the feedback voltage VFB. At time T2, the voltage CHS falls to a low level, and like the voltage CHS, the signal SC also falls to a low level. Then, the voltage CHS is at a low level, and the signal SC is at a low level like the voltage CHS. Then, the transistor 43 is turned on, and the capacitor CSS is charged by the current I1. Thus, the soft start voltage VSS increases. As the soft start voltage VSS increases, the output voltage VO increases and thus the feedback voltage VFB increases.

At time T3, the feedback voltage VFB reaches the input detection voltage VIND. At time T3, the voltage CHS rises to a high level, and like the voltage CHS, the signal SC also rises to a high level. Then, the transistor 44 is turned on, and the capacitor CSS is discharged by the current I2. Thus, the soft start voltage VSS decreases. As the soft start voltage VSS decreases, the output voltage VO decreases and also the feedback voltage VFB decreases.

At time T4, the input detection voltage VIND becomes higher than the feedback voltage VFB. At time T4, the voltage CHS falls to a low level, and like the voltage CHS, the signal SC falls to a low level. Then, the transistor 43 is turned on, and the capacitor CSS is charged by the current I1. Thus, the soft start voltage VSS increases. As the soft start voltage VSS increases, the output voltage VO increases and also the feedback voltage VFB increases.

The soft start time period ends at time T5, and the signal SC is maintained at a low level after time T5. Thus, the transistor 43 is in an ON state, and the transistor 44 is in an OFF state. The soft start voltage VSS is maintained as a Zener voltage by the Zener diode 46.

Figure 5:
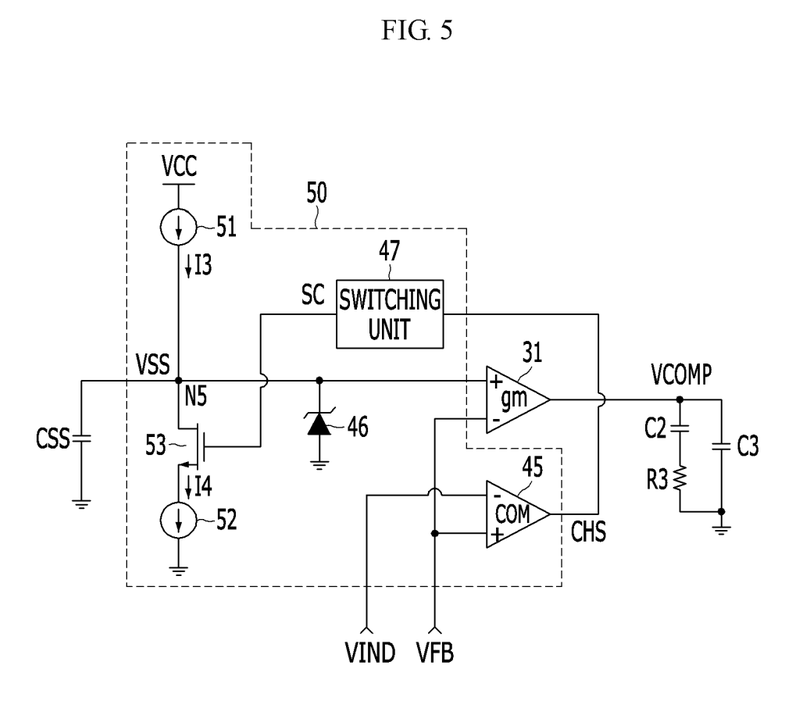
FIG. 5 is a diagram showing a soft start circuit according to another embodiment.

FIG. 5 is a diagram showing a soft start circuit according to another embodiment.

The same reference numerals are used for the same elements as those in the above embodiment, and descriptions thereof will be omitted.

As shown in FIG. 5, a soft start circuit 50 includes a current source 51, a current sink 52, a transistor 53, a comparator 45, a Zener diode 46, and a switching unit 47.

The current source 51 is connected to a node N5 and is configured to supply an current I3 to the capacitor CSS. The transistor 53 is connected between the current sink 52 and the node N5. The current sink 52 sinks an current I4 from the capacitor CSS to the ground through the transistor 53.

During an OFF time period of the transistor 53, the capacitor CSS is charged by the current I3, and thus the soft start voltage VSS increases.

During an ON time period of the transistor 53, the capacitor CSS is discharged by an current I4-I3, which is a difference between the current I4 and the current I3, and thus the soft start voltage VSS decreases. For this, the current I4 is larger than the current I3.

The transistor 53 is an n-channel type transistor. Accordingly, when the feedback voltage VFB is equal to or higher than the input detection voltage VIND during the soft start time period, the transistor 53 is turned on by a signal SC, and the soft start voltage VSS decreases due to the current I4-I3. When the feedback voltage VFB is lower than the input detection voltage VIND, the transistor 53 is turned off by the signal SC, and the soft start voltage VSS increases due to the current I3.

Figure 6:
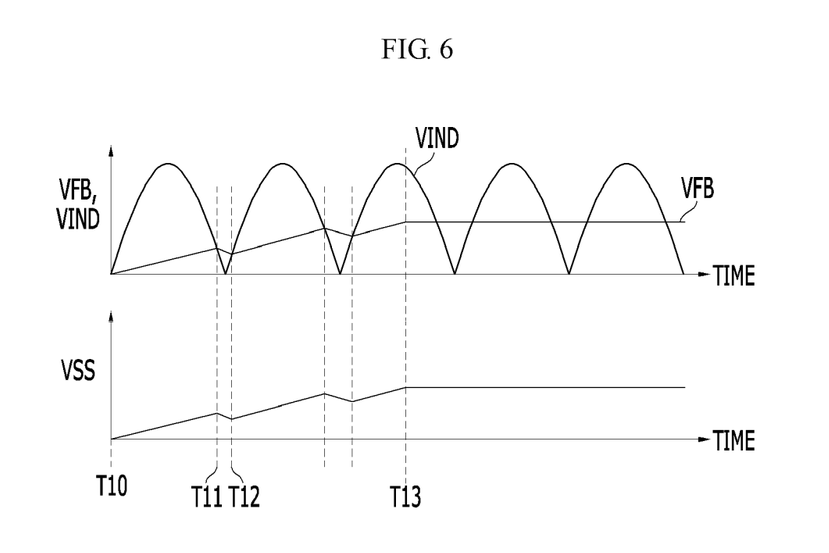
FIG. 6 is a waveform chart showing an input detection voltage, a feedback voltage, and a soft start voltage according to another embodiment.

FIG. 6 is a waveform chart showing an input detection voltage, a feedback voltage, and a soft start voltage according to another embodiment.

As shown in FIG. 6, since the input detection voltage VIND is higher than the feedback voltage VFB during a time period between T10 and T11, the transistor 53 is in an OFF state. The capacitor CSS is charged by the current I3, and thus the soft start voltage VSS increases.

Since the feedback voltage VFB is higher than the input detection voltage VIND during a time period between T11 and T12, the transistor 53 is turned on. Thus, the capacitor CSS is discharged by the current I4-I3, and the soft start voltage VSS decreases. As the soft start voltage VSS decreases, the output voltage VO decreases and also the feedback voltage VFB decreases.

At time T13, the soft start time period ends, and the soft start voltage VSS is maintained as a Zener voltage.

In this way, the soft start voltage VSS may decrease when the feedback voltage VFB is higher than the input detection voltage VIND. The present invention is not limited thereto. According to still another embodiment, when the feedback voltage VFB is higher than the input detection voltage VIND, the soft start voltage VSS may be maintained at a constant level instead of decreasing.

Figure 7:
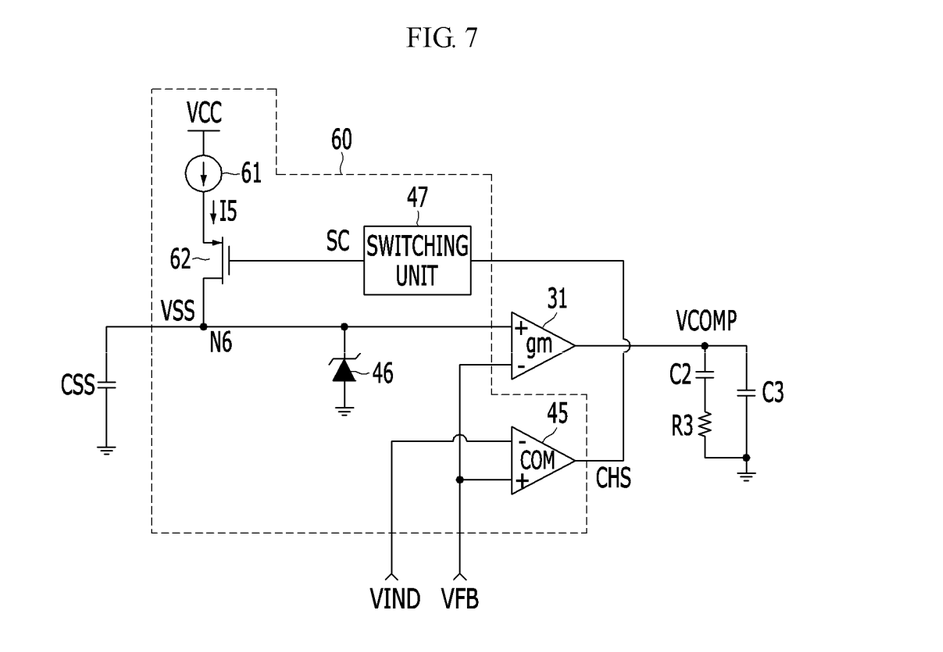
FIG. 7 is a diagram showing a soft start circuit according to still another embodiment.

FIG. 7 is a diagram showing a soft start circuit according to still another embodiment.

The same reference numerals are used for the same elements as those in the above embodiment, and descriptions thereof will be omitted.

As shown in FIG. 7, a soft start circuit 60 includes a current source 61, a transistor 62, a comparator 45, a Zener diode 46, and a switching unit 47.

The current source 61 is connected to a node N6 and is configured to supply an current I5 to the capacitor CSS. During an ON time period of the transistor 62, the capacitor CSS is charged by the current I5, and thus the soft start voltage VSS increases. During an OFF time period of the transistor 62, the capacitor CSS maintains the soft start voltage VSS.

The transistor 62 is a p-channel type transistor. Accordingly, when the feedback voltage VFB is equal to or higher than the input detection voltage VIND during the soft start time period, the transistor 62 is turned off by a signal SC, and the soft start voltage VSS is maintained at a constant level. When the feedback voltage VFB is lower than the input detection voltage VIND, the transistor 62 is turned on by the signal SC, and the soft start voltage VSS increases due to the current I5.

Figure 8:
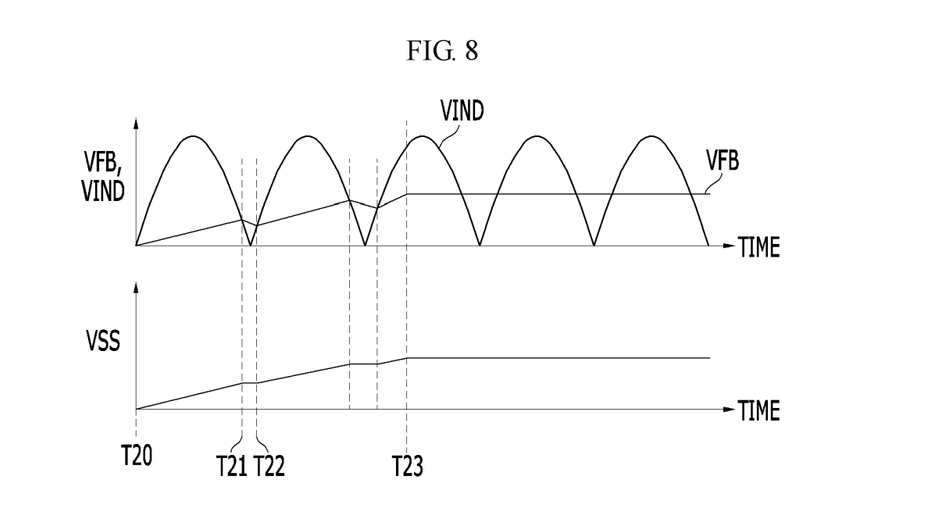
FIG. 8 is a waveform chart showing an input detection voltage, a feedback voltage, and a soft start voltage according to still another embodiment.

FIG. 8 is a waveform chart showing an input detection voltage, a feedback voltage, and a soft start voltage according to still another embodiment.

As shown in FIG. 8, since the input detection voltage VIND is higher than the feedback voltage VFB during a time period between T20 and T21, the transistor 62 is in an ON state. The capacitor CSS is charged by the current I5, and the soft start voltage VSS increases.

Since the feedback voltage VFB is higher than the input detection voltage VIND during a time period between T21 and T22, the transistor 62 is turned off. Thus, the soft start voltage VSS is maintained at a constant level by the capacitor CSS. In this case, the output voltage VO may be decreased by an current supplied to the load RL, and also the feedback voltage VFB may be decreased.

At time T23, the soft start time period ends, and the soft start voltage VSS is maintained as a Zener voltage.

In this way, the soft start voltage VSS may be maintained when the feedback voltage VFB is higher than the input detection voltage VIND. The present invention is not limited thereto. According to still another embodiment, when the output voltage VO is higher than the input detection voltage VIND, an increasing slope of the soft start voltage VSS may decrease.

Figure 9:
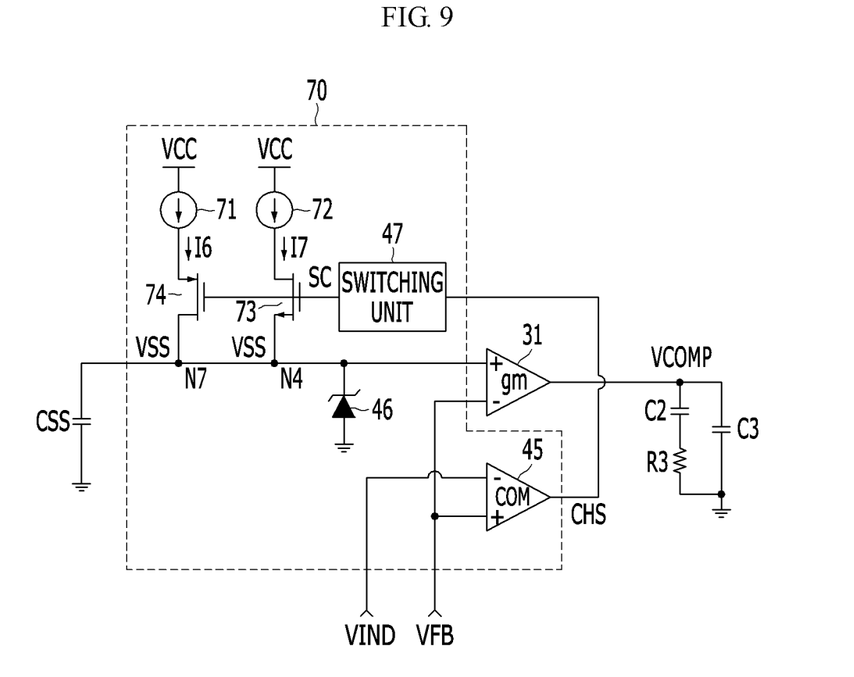
FIG. 9 is a diagram showing a soft start circuit according to still another embodiment.

FIG. 9 is a diagram showing a soft start circuit according to still another embodiment.

The same reference numerals are used for the same elements as those in the above embodiment, and descriptions thereof will be omitted.

As shown in FIG. 9, a soft start circuit 70 includes two current sources 71 and 72, two transistors 73 and 74, a comparator 45, a Zener diode 46, and a switching unit 47.

The transistor 74 is connected between the current source 71 and a node N7. The current source 71 supplies an current I6 to the capacitor CSS through the transistor 74.

The transistor 73 is connected between the current source 72 and the node N7. The current source 72 supplies an current I7 to the capacitor CSS through the transistor 73.

The current I6 is greater than the current I7. The transistor 74 is a p-channel type transistor, and the transistor 73 is an n-channel type transistor. During an ON time period of the transistor 74, the transistor 73 is in an OFF state. The capacitor CSS is charged by the current I6, and the soft start voltage VSS increases. During an ON time period of the transistor 73, the transistor 74 is in an OFF state, and the capacitor CSS is charged by the current I7. Thus, the soft start voltage VSS increases.

When the feedback voltage VFB is equal to or higher than the input detection voltage VIND during the soft start time period, the transistor 73 is turned on by a signal SC, and thus the soft start voltage VSS increases with a slope corresponding to the current I7. When the feedback voltage VFB is lower than the input detection voltage VIND, the transistor 74 is turned on by the signal SC, and thus the soft start voltage VSS increases with a steeper slope corresponding to the current I6.

Figure 10:
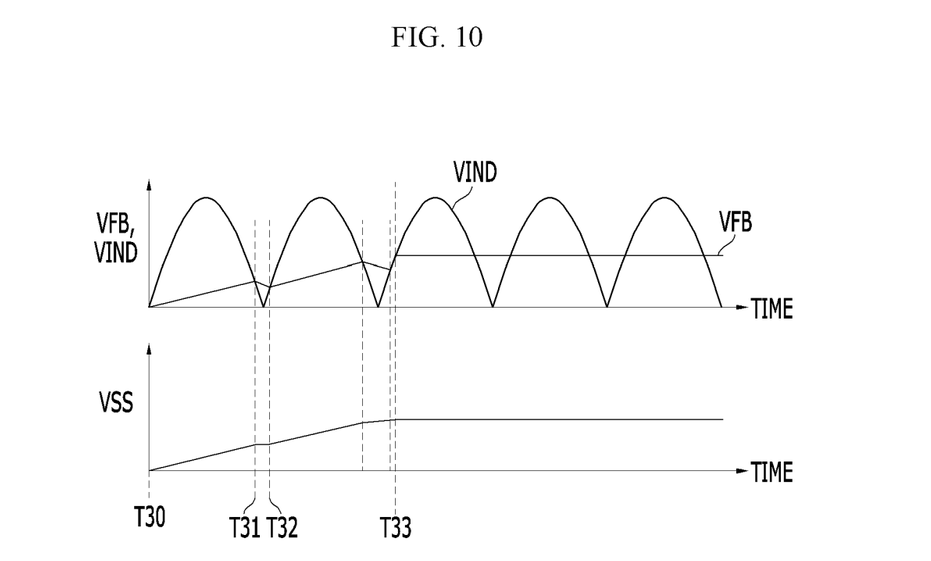
FIG. 10 is a waveform chart showing an input detection voltage, a feedback voltage, and a soft start voltage according to still another embodiment.

FIG. 10 is a waveform chart showing an input detection voltage, a feedback voltage, and a soft start voltage according to still another embodiment.

As shown in FIG. 10, since the input detection voltage VIND is higher than the feedback voltage VFB during a time period between T30 and T31, the transistor 74 is in an ON state. The capacitor CSS is charged by the current I6, and the soft start voltage VSS increases.

Since the feedback voltage VFB is higher than the input detection voltage VIND during a time period between T31 and T32, the transistor 73 is turned on. Thus, the capacitor CSS is charged by the current I7, and the soft start voltage VSS increases.

An increasing slope of the soft start voltage VSS during the time period between T30 and T31 is greater than an increasing slope of the soft start voltage VSS during the time period between T31 and T32. In the time period between T31 and T32, the output voltage VO may be decreased by an current supplied to the load RL, and also the feedback voltage VFB may be decreased.

At time T33, the soft start time period ends, and the soft start voltage VSS is maintained as a Zener voltage.

In this way, the changing slope of the soft start voltage VSS may be controlled to be different when the feedback voltage VFB is higher than the input detection voltage VIND.

According to the above-described embodiments, it is possible to suppress saturation of the comparison voltage VCOMP to minimize an overshoot of the output voltage VO after the soft start time period ends.

Figure 11A:
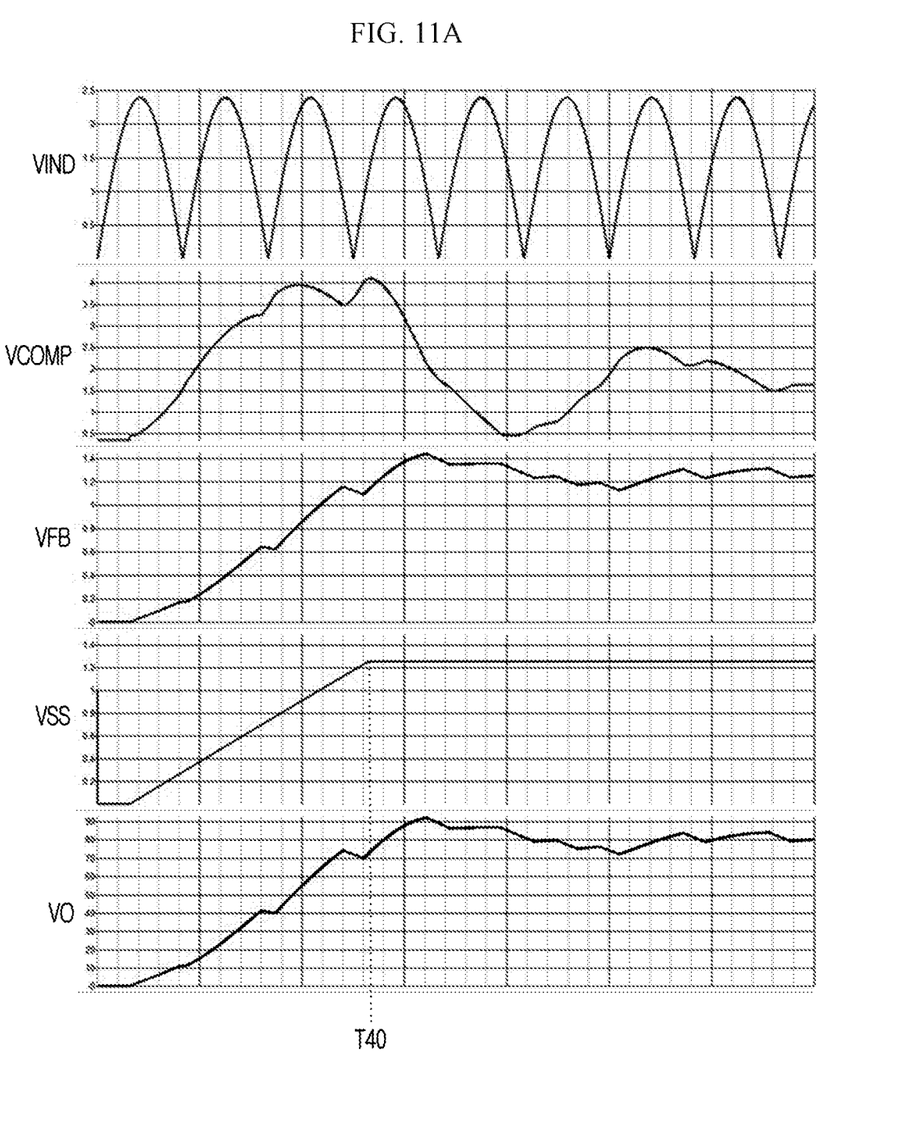
FIG. 11A shows a voltage waveform according to a conventional soft start circuit.
Figure 11B:
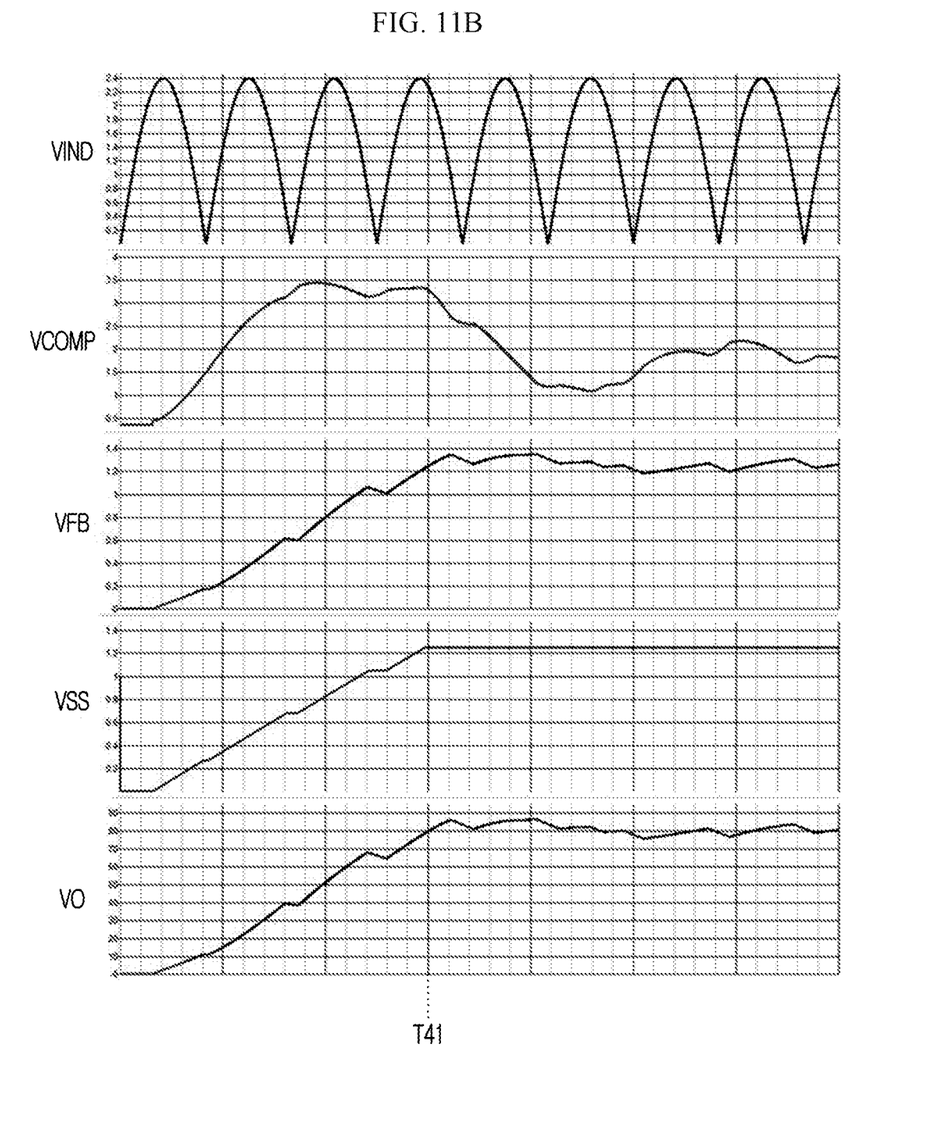
FIG. 11B is a voltage waveform chart in a soft start circuit according to an embodiment shown in FIG. 7.

FIG. 11A shows a voltage waveform according to a conventional soft start circuit, and FIG. 11B is a voltage waveform chart in a soft start circuit according to an embodiment shown in FIG. 7.

As shown in FIG. 11A, the comparison voltage VCOMP rises to a very high voltage and becomes saturated during the soft start time period. After time T40 at which the soft start ends, a peak of the output voltage increases to about 92 V, thereby causing an overshoot.

Unlike this, the comparison voltage VCOMP shown in FIG. 11B according to an embodiment is at a low voltage, compared to the comparison voltage VCOMP shown in FIG. 11A. After time T41 at which the soft start ends, the peak of the output voltage is about 86 V. It can be seen that the overshoot is decreased.

Although the exemplary embodiments of the present invention have been described in detail, the scope of the present invention is not limited thereto, but modifications and alterations made by those skilled in the art using the basic concept of the present invention defined in the following claims fall within the scope of the present invention.

What is claimed is:

1. A method of controlling a power switch in a converter circuit, the method comprising:
   during a soft start time period:
      comparing a feedback voltage corresponding to an output voltage of an output terminal of the converter circuit to an input detection voltage corresponding to an input voltage of an input terminal of the converter circuit,
      causing the soft start voltage to increase at a first slope in response to the feedback voltage being lower than the input detection voltage,
      causing the soft start voltage to change according to a second slope different from the first slope in response to the feedback voltage being higher than the input detection voltage, and
      controlling switching of the power switch using the soft start voltage and the feedback voltage,
   wherein the power switch is coupled to an inductor between the input terminal of the converter circuit and the output terminal of the converter circuit,
   wherein the input voltage is an Alternating Current (AC) voltage, and
   wherein the input detection voltage is a rectified AC voltage.

2. The method of claim 1, further comprising decreasing the soft start voltage during the soft start time period when the feedback voltage is higher than the input detection voltage.

3. The method of claim 2, further comprising:
   comparing the feedback voltage and the input detection voltage;
   switching a first transistor according to a result of comparing the feedback voltage and the input detection voltage, the first transistor having a first end coupled to a capacitor by which the soft start voltage is generated and a second end coupled to a current sink.

4. The method of claim 3, wherein a current source is coupled to the capacitor.

5. The method of claim 4, further comprising switching a second transistor according to the result of comparing the feedback voltage and the input detection voltage, wherein the second transistor is coupled between the capacitor and the current source.

6. The method of claim 1, further comprising maintaining the soft start voltage at a constant level during the soft start time period when the feedback voltage is higher than the input detection voltage.

7. The method of claim 6, further comprising:
comparing the feedback voltage and the input detection voltage;
switching a transistor according to a result of comparing the feedback voltage and the input detection voltage, the transistor having a first end coupled to a capacitor by which the soft start voltage is generated and having a second end coupled to a current source.

8. The method of claim 1, further comprising increasing the soft start voltage at the second slope during the soft start time period when the feedback voltage is higher than the input detection voltage, wherein the first slope is greater than the second slope.

9. The method of claim 8, further comprising:
comparing the feedback voltage and the input detection voltage;
switching a first transistor according to a result of comparing the feedback voltage and the input detection voltage, the first transistor having a first end coupled to a capacitor by which the soft start voltage is generated and a second end coupled to a first current source;
switching a second transistor according to the result of comparing the feedback voltage and the input detection voltage, the second transistor having a first end coupled to the capacitor and a second end coupled to a second current source.

10. The method of claim 9, wherein the first transistor and the second transistor have different channel types.

11. A method of controlling a buck converter, the method comprising:
during a soft start time period:
comparing a feedback voltage corresponding to an output voltage of the buck converter and an input detection voltage corresponding to an input voltage,
causing the soft start voltage to increase at a first slope in response to the feedback voltage being lower than the input detection voltage,
causing the soft start voltage to change at a second slope different from the first slope in response to the feedback voltage being higher than the input detection voltage, and
controlling switching of a power switch using the soft start voltage,
wherein the power switch has a first end that receives the input voltage,
wherein the input voltage is an Alternating Current (AC) voltage, and
wherein the input detection voltage is a rectified AC voltage.

12. The method of claim 11, further comprising decreasing the soft start voltage during the soft start time period when the feedback voltage is higher than the input detection voltage.

13. The method of claim 12, wherein the method comprises:
comparing the feedback voltage and the input detection voltage;
switching a first transistor according to a result of comparing the feedback voltage and the input detection voltage, the first transistor having a first end coupled to a capacitor by which the soft start voltage is generated and a second coupled to a current sink.

14. The method of claim 13, wherein a current source is coupled to the capacitor.

15. The method of claim 14, further comprising switching a second transistor according to the result of comparing the feedback voltage and the input detection voltage, the second transistor being coupled between the capacitor and the current source.

16. The method of claim 11, further comprising maintaining the soft start voltage at a constant level during the soft start time period when the feedback voltage is higher than the input detection voltage.

17. The method of claim 16, further comprising:
comparing the feedback voltage and the input detection voltage;
switching a transistor according to a result of comparing the feedback voltage and the input detection voltage, the transistor having a first end coupled to a capacitor by which the soft start voltage is generated and a second end coupled to a current source.

18. The method of claim 11, further comprising increasing the soft start voltage at the second slope during the soft start time period when the feedback voltage is higher than the input detection voltage, wherein the first slope is greater than the second slope.

19. The method of claim 18, further comprising:
comparing the feedback voltage and the input detection voltage;
switching a first transistor according to a result of comparing the feedback voltage and the input detection voltage, the first transistor having a first end coupled to a capacitor by which the soft start voltage is generated and a second end coupled to a first current source;
switching a second transistor according the result of comparing the feedback voltage and the input detection voltage, the second transistor having a first end coupled to the capacitor and a second end coupled to a second current source.

20. The method of claim 19, wherein the first transistor and the second transistor have different channel types.

* * * * *